US006912085B2

United States Patent
Hakomori et al.

(10) Patent No.: US 6,912,085 B2
(45) Date of Patent: Jun. 28, 2005

(54) OPTICAL AMPLIFIER

(75) Inventors: Katsuhiko Hakomori, Sapporo (JP);
Hiroyuki Furukawa, Sapporo (JP);
Kazuhito Ogawa, Sapporo (JP)

(73) Assignee: Fujitsu Limited, Kawasaki (JP)

(*) Notice: Subject to any disclaimer, the term of this patent is extended or adjusted under 35 U.S.C. 154(b) by 0 days.

(21) Appl. No.: 10/325,963

(22) Filed: Dec. 23, 2002

(65) Prior Publication Data

US 2004/0012842 A1 Jan. 22, 2004

(30) Foreign Application Priority Data

Jul. 17, 2002 (JP) .................................... 2002-207910

(51) Int. Cl.[7] .............................................. H01S 3/00
(52) U.S. Cl. .............................................. 359/341.41
(58) Field of Search ...................... 359/341.41, 341.4, 359/341.42, 341.43, 341.44

(56) References Cited

U.S. PATENT DOCUMENTS

| | | | | |
|---|---|---|---|---|
| 5,517,351 A | * | 5/1996 | Hatakeyama | 359/341.41 |
| 5,768,011 A | * | 6/1998 | Amaki et al. | 359/341.4 |
| 5,838,488 A | * | 11/1998 | Kobayashi | 359/341.41 |
| 5,892,616 A | * | 4/1999 | Takahashi | 359/341.43 |
| 6,038,062 A | * | 3/2000 | Kosaka | 359/337 |
| 6,304,371 B1 | * | 10/2001 | Sugiya et al. | 359/341.4 |
| 6,348,987 B1 | * | 2/2002 | Tomofuji | 398/147 |
| 6,384,965 B2 | * | 5/2002 | Akiyama | 359/341.4 |
| 6,542,291 B1 | * | 4/2003 | Kinoshita et al. | 359/341.33 |
| 6,606,447 B2 | * | 8/2003 | Brown et al. | 385/140 |
| 6,611,373 B2 | * | 8/2003 | Takahashi | 359/341.4 |
| 6,678,088 B1 | * | 1/2004 | Stummer et al. | 359/341.41 |
| 2003/0117698 A1 | * | 6/2003 | Williams et al. | 359/341.41 |

* cited by examiner

*Primary Examiner*—Thomas H. Tarcza
*Assistant Examiner*—Deandra M. Hughes
(74) *Attorney, Agent, or Firm*—Staas & Halsey LLP

(57) ABSTRACT

An optical amplifier amplifies a light signal inputted to an optical amplifier fiber and outputs an amplified light signal, by exciting the fiber with an excitation light. The optical amplifier can keep its output light level constant and stable and reduce the excitation light when the light inputted to the fiber is cut off, just by detecting the optical output level at a post-stage of the fiber. The optical amplifier comprises a first control circuit, a second control circuit and a selector circuit. The first control circuit amplifies the difference between a first predetermined voltage and an o/e-converted voltage of the optical amplifier fiber output light to output an amplified voltage. The second control circuit amplifies the difference between the o/e-converted voltage of the excitation light and a selected one of the first control circuit output voltage and a second predetermined voltage to output an amplified voltage and controls the excitation light based on the second control circuit output voltage. The selector circuit detects a change in the first control circuit output voltage and depending on the change, selects the first control circuit output voltage or a second predetermined voltage.

8 Claims, 12 Drawing Sheets

OPTICAL AMPLIFIER

BACKGROUND OF THE INVENTION

1. Field of the Invention

The present invention relates to an optical amplifier utilizing an optical amplifier fiber, especially to a simplified optical amplifier which can, keep the output light of the optical amplifier fiber constant and stable and which can reduce the output level of the excitation light source when the input light is cut off to the fiber, without need to detect the optical output level at a pre-stage of the fiber to reduce the output light of the excitation light source for exciting the energy level of an erbium-doped fiber, but just by detecting the optical output level at a post-stage of the fiber.

The photonic network, which uses an optical signal as a carrier for communications, has spread widely while meeting the demand for communications mainly because:

(1) The optical signal is resistant to electric noises, (2) A repeater is substantially unnecessary but for a specific transmission line including an optical submarine transmission line, because the optical transmission line is low in transmission loss, (3) It is suitable for high-speed data transmission because the optical transmission line has a wide band-width which is required by an optical signal as a communication carrier, and (4) Conversion between an optical signal and an electric signal is performed at a high speed thanks to the advent of an electric-to-optical converter (hereinafter called e/o converter) and an optical-to-electric converter (hereinafter called o/e converter).

A high-speed data transmission rate for even larger communication capacity is required to cope with a rapid increase in the communication demand brought about by the recent development of the Internet. Also, a demand for introduction of the photonic network into the subscriber lines is ever increasing. To introduce the photonic network into the subscriber lines, a wide dynamic range is required to cope with the variation in the length of the subscriber lines. Also, a significant cost reduction of the photonic network itself is required to mitigate an economical burden on the subscribers. Accordingly, an expansion of the dynamic range of the optical receiver device in the photonic network and a reduction of the cost of the optical amplifier are especially important.

2. Description of the Related Art

FIG. 4 shows an optical receiver (part 1) in a photonic network, along with an optical sender and an optical transmission line. In FIG. 4, the reference 1 shows an optical sender comprised of an e/o converter 11 and an optical output amplifier 12, for receiving an electric data signal from the data sender and converting the signal into an optical signal to output the optical signal to an optical transmission line.

2 is an optical transmission line for transmitting an optical signal modulated by transmission data. A single-mode optical fiber is chiefly used for the optical transmission line recently. 3 shows the optical receiver comprised of an o/e converter 32 and an electric signal regenerator 33, for converting a received optical signal into an electric signal and for regenerating data from the optical signal which was modulated by the data.

In the o/e converter 32 of FIG. 4, the received optical signal is supplied to a photodiode and the optical signal is converted into an electric (current) signal. In this case, if a usual photodiode is used, it is difficult to obtain a satisfactory dynamic range from the restriction that optical-to-electric conversion efficiency is not sufficiently high. If an avalanche photodiode with an electron multiplier function is used for the o/e-converter 32, the dynamic range of the optical receiver device can be greatly increased since the gain for a received optical signal can be increased equivalently.

However, attempting to increase the dynamic range by using the avalanche photodiode will cause the following problems:

(1) Since the avalanche photodiode is comparatively slow in response speed, it can convert an optical signal to an electric signal faithfully for one-digit gigabit-order data rate; however, for two-digit gigabit-order data rate, the converted electric signal waveform is distorted, causing a degradation of error rate in the electric signal reproduction circuit 33.

(2) Since the avalanche photodiode generates a comparatively large noise in the electron multiplication process, the S/N ratio in the o/e-converter 32 is reduced, causing a degradation of the error rate in the electric signal regenerator 33.

FIG. 5 shows an optical receiver (part 2) in a photonic network, along with an optical sender and an optical transmission line. In FIG. 5, reference 1 shows an optical sender which receives an electric data signal from a data sender and converts the signal into an optical signal to send to the optical transmission line. The optical sender 1 is comprised of an e/o converter 11 and an optical output amplifier 12. 2 shows an optical transmission line for transmitting the optical signal which was modulated with data. The single mode optical fiber is used chiefly for the line recently.

3a shows an optical receiver for converting the received optical signal into an electric signal, regenerating data by which the optical signal was modulated and supplying the data to a data receiver. The optical receiver 3a is comprised of an optical pre-amplifier 31, o/e converter 32 and electric signal regenerator 33. In FIG. 5, since the optical pre-amplifier 31 is disposed at the pre-stage of the o/e converter 32, the dynamic range can be expanded roughly by the amount of the gain provided by the optical pre-amplifier 31.

FIG. 1 shows a fundamental circuit configuration of a conventional optical amplifier which is applied to the optical output amplifier in FIG. 4 and FIG. 5 and optical pre-amplifier in FIG. 5. The optical output amplifier in FIGS. 4 and 5 is arranged to obtain a sufficient optical output level for the optical sender 1. The optical pre-amplifier in FIG. 5 is arranged to expand the dynamic range for the optical receiver 3.

In FIG. 1, reference 31-1 is a coupler for branching the input light into a main signal light and an input monitor light. 31-2 is an optical amplifier fiber for amplifying the main signal light. 31-3 is an excitation laser diode for generating an excitation light to be supplied to the optical amplifier fiber 31-2. The excitation laser diode is taken here as an example to supply the excitation light to the optical amplifier fiber. However, the excitation light source is not necessarily restricted to the excitation laser diode, but it can be any device that can generate light of a wavelength suited to excite an optical amplifier fiber.

31-4 is an excitation laser diode (abbreviated to LD) driver for supplying a driving current to the excitation laser diode 31-3. 31-5 is a coupler for coupling the excitation light outputted by the excitation laser diode 31-3 with the optical amplifier fiber 31-2. The excitation light is supplied to the optical amplifier fiber 31-2 through the coupler 31-5 and causes the main signal light to be amplified. The amplified main signal light propagates toward the output side through the coupler 31-5.

31-6 is a coupler for branching the optical signal from the coupler 31-5 into an output light and an output monitor light. 31-7 is an optical filter for removing the excitation light mixed in the output monitor light. The optical filter 31-7 is shown in FIG. 1 as an optical low-pass filter, meaning a filter to pass the light of low frequency. This is because, for a usual optical amplifier fiber which has erbium ion doped, the wave length of the excitation light is about 1.48 microns and that of the main signal light is about 1.55 microns and thus, the low-pass optical filter is required to remove the excitation light.

31-8 shows an o/e converter for converting the optical signal (simply called so here, although, to be strict, it includes the spontaneous emission light which is generated by the optical amplification in the optical amplifier fiber) outputted by the optical filter 31-7 into an electric signal. 31-9 is a reference voltage source. 31-10a is an automatic level control (abbreviated to ALC) circuit for keeping the output light level constant by comparing the output of the o/e converter 31-8 with the constant output voltage of the reference voltage source 31-9. The automatic level controller 31-10a supplies an automatic level control signal to the excitation laser diode driver 31-4. The output light level of the optical amplifier in FIG. 1 is kept, constant by controlling the output current of the excitation laser diode driver 31-4 according to the automatic level control signal and by controlling the level of the excitation light of the excitation laser diode 31-3.

31-11 is an optical filter for removing the excitation light element included in the input monitor light. The optical filter 31-7 is illustrated here too, as an optical low pass filter. The reason is the same as the optical filter 31-11 is an optical low pass filter.

31-12 is an o/e converter for converting the optical signal outputted by the optical filter 31-11 into an electric signal. 31-13 is an input level monitor for monitoring the level of the electric signal outputted by the o/e converter 31-12 and when the level of the optical signal is less than a defined level, halting the excitation laser (diode driver 31-4 to shut down the excitation light and for generating finally an output halt signal for halting the amplification operation of the optical amplifier fiber 31-2.

Here, the reason why the amplification operation by the optical amplifier fiber 31-2 is halted when it is determined that the input light level is less than the defined level due to the output halt signal outputted by the input level monitor 31-13 and the input light is shut down, is: (1) to prevent the excitation laser diode 31-3 from deteriorating due to the fact that when the level of the input light is less than the defined level, the output power of the excitation laser diode 31-3 becomes too large because the automatic level controller 31-10a attempts to keep the level of the output light constant (2) to prevent the post-stage optical parts and devices from deteriorating due to an optical surge caused by the output power of the excitation laser diode 31-3 being too large when the level of the input light recovers from the once-dropped level. That is, since the thus-constructed circuit in FIG. 1 can obtain a constant-level output light and even when the input light is shut down, can realize a reliable optical amplifier, both the optical sender 1 in FIG. 4 and optical receiver 3 in FIG. 5 can be guaranteed in performance and reliability.

However, since the optical amplifier is equipped with the o/e converter 31-12 including a set of the coupler 31-1, optical filter 31-11 and photodiode in order to halt the optical amplification operation by the input level monitor 31-13 and with the o/e converter 31-8 including a set of the coupler 31-6, optical filter 31-7 and photodiode in order to perform the automatic level control, a problem arises that the cost of the optical amplifier increases. This is not only because the optical devices per se including the coupler, optical filter and photodiode are costly, but because the parts required for mounting those devices are costly and also the adjusting and fixing work are costly.

To reduce the cost, the forward-controlled optical amplifier and backward-controlled optical amplifier have been developed. FIG. 2 shows a fundamental circuit configuration of a conventional forward-controlled optical amplifier. In FIG. 2, reference 31-1 is a coupler for branching the input light into a main signal light and input monitor light. 31-2 is an optical amplifier fiber for amplifying the main signal light. 31-3 is an excitation laser diode for generating the excitation light to be supplied to the optical amplifier fiber 31-2. 31-4 is an excitation laser diode driver for supplying a driving current to the excitation laser diode 31-3. 31-5 is a coupler for supplying the excitation light outputted by the excitation laser diode 31-3 to the optical amplifier fiber 31-2. 31-11 is an optical filter for removing the excitation light component mixed with the input monitor light. The optical filter 31-11 is shown here as a low-pass filter for the same reasons as already described.

31-12 is an o/e converter for converting an optical signal outputted by the optical filter 31-11 into an electric signal. 31-9 is a reference voltage source. 31-10a is an automatic level controller for keeping the output light at a constant level by comparing the output of the o/e converter 31-12 with the constant output voltage of the reference voltage source 31-9. The automatic level controller 31-10a supplies an automatic level control signal to the excitation laser diode driver 31-4. The output light of the optical amplifier in FIG. 2 is kept constant by controlling the output current of the excitation laser diode driver 31-4 and the excitation light level of the excitation laser diode 31-3 according to the automatic level control signal.

31-13 is an input level monitor for monitoring the electric output signal voltage of the o/e converter 31-12 when the output light signal level is lower than a defined level, i.e., when the input light level is lower than a defined level, for halting the excitation laser diode driver 31-4 to shut down the excitation light and generating finally an output halt signal for halting the amplification operation of the optical amplifier fiber 31-2. The reason is the same as aforesaid why the amplification operation of the optical amplifier fiber 31-2 is halted by the output halt signal outputted by the input level monitor 31-13 when the input light level is loner than the defined level.

The circuit in FIG. 2 features that the automatic level controller 31-10a generates the automatic level control signal by comparing the signal to which the aforesaid input monitor light has been o/e-converted with the constant output voltage of the reference voltage source 31-9, controls the driving current of the excitation laser diode 31-3, keeps the optical amplifier output level constant and when the input light level becomes lower than a defined level, halts the optical amplification operation. That is, when the optical amplifier in FIG. 2 is used as the optical output amplifier in FIGS. 4 and 5, the optical signal level on the optical transmission line can be raised high enough. When the optical amplifier in FIG. 2 is used as the optical pre-amplifier in FIG. 5, the dynamic range of the optical receiver 3 can be expanded.

Thus, the optical amplifier output level can be kept constant without monitoring its output level and when the input light level becomes lower than a defined level, the optical amplification operation can be halted. Thus, the cost of the optical amplifier and optical sender/receiver can be reduced.

FIG. 3 shows a fundamental circuit configuration of a conventional backward-controlled optical amplifier. In FIG. 3, reference 31-2 is an optical amplifier fiber for amplifying the input light. 31-3 is an excitation laser diode for generating an excitation light to be supplied to the optical amplifier fiber 31-2. 31-4 is an excitation laser diode driver for supplying a driving current to the excitation laser diode 31-3. 31-5 is a coupler for coupling the excitation light of the excitation laser diode 31-3 to the optical amplifier fiber 31-2. The excitation light is then supplied to the optical amplifier fiber 31-2 through the coupler 31-5 to amplify the main signal light. The amplified main signal light propagates to the output side through the coupler 31-5.

31-6 is a coupler for branching an optical signal output from the coupler 31-5 into an output light and an output monitor light. 31-7 is an optical filter for removing the excitation light which is mixed in the output monitor light.

The optical filter 31-7 is shown here as a low-pass filter for the same reasons as already described.

31-8 is an o/e converter for converting a light signal output from the optical filter 31-7 into an electric signal. 31-9 is a reference voltage source. 31-10a is an automatic level controller for keeping the output light level constant by comparing the output of the o/e converter 31-8 with the constant output voltage of the reference voltage source 31-9. The automatic level control circuit 31-10a supplies an automatic level control signal to the excitation laser diode driver 31-4. The output light level of the optical amplifier in FIG. 3 is kept constant by controlling the output current of the excitation laser diode driver 31-4 and the level of the excitation light of the excitation laser diode 31-3 according to the automatic level control signal.

The circuit in FIG. 3 features that the automatic level controller 31-10a generates the automatic level control signal by comparing the signal to which the input monitor light was o/e-converted with the constant output voltage of the reference voltage source 31-9, controls the driving current of the excitation laser diode 31-3 and keeps the optical amplifier output level constant. That is, when the optical amplifier in FIG. 3 is used as the optical output amplifier in FIGS. 4 and 5, the optical signal level on the optical transmission line can be kept high enough. When the optical amplifier in FIG. 3 is used as the optical pre-amplifier in FIG. 5, the dynamic range of the optical receiver 3 can be expanded. Then, the optical amplifier output level can be kept constant without monitoring the level of the light input to the optical amplifier. Thus, the cost of the optical amplifier and optical sender/receiver can be reduced.

In the circuit in FIG. 2, ambient temperature changes and aging have most influence on the excitation light level with respect to the driving current of the excitation laser diode 31-3. With the circuit in FIG. 2, the driving current is supplied to the excitation laser diode 31-3 only from the excitation laser diode driver 31-4 which is controlled by the feed-forward-controlled automatic level controller 31-10a. However, the circuit is not constructed such that it compensates the level fluctuations caused by the temperature changes and aging of the excitation laser diode 31-3, that is, the excitation laser diode 31-3 is not provided with a feedback for automatic level control.

Therefore, the circuit can keep the optical sender output level high enough, expand the dynamic range of the optical receiver and reduce the cost of the amplifier and the optical sender/receiver. However, since the circuit cannot prevent the changes in the output current of the excitation laser diode caused by the temperature changes and aging, the stability of the photonic network cannot be secured.

To solve this, it is necessary to set the output voltage of the reference voltage source so as to cancel the temperature change and aging characteristics of the excitation laser diode. This is not impossible in principle, but is difficult, to realize and results in a cost increase. That is, a circuit containing a resistor having a special temperature characteristic can cancel the aforesaid temperature characteristics, but it can hardly cancel the aging characteristics.

Thus, it is necessary to control the driving current by using a central processor based on the measured data of the temperature characteristic and predicted data of the excitation laser diode aging characteristic. However, using the central processing unit per se causes a cost increase. Moreover, it is very difficult to obtain accurate predicted data of the excitation laser diode aging characteristic, causing a further cost increase.

In the circuit in FIG. 3, since the automatic level controller 31-10a is controlled by the signal into which the output monitor light is o/e-converted, the influence of the ambient temperature change and aging on the level of the excitation light of the excitation laser diode 31-3 can be removed. However, in the aforesaid backward control method by simply using the signal into which the output monitor light is o/e-converted, the reliability of the excitation laser diode 31-3 decreases because when the input light is cutoff, the level of the excitation light of the excitation laser diode 31-3 rises very high. Also, the method cannot protect the post-stage optical parts and circuits from damages caused by an optical surge. The optical surge occurs because the level of the excitation light of the excitation laser diode 31-3 rises too high when the once-cut-off input light recovers.

SUMMARY OF THE INVENTION

It is an object of the present invention to provide an optical amplifier whose output level can be kept constant just by detecting the optical signal level at a post-stage of the optical amplifier fiber, without need to detect the optical signal level at a pre-stage of the fiber and to control the output light of the excitation light source to excite the energy level of the fiber.

It is another object of the present invention to provide an optical amplifier which can reduce the output light of the excitation light source when the input light is cut off.

To achieve the above and other objects, the first aspect of the present invention provides a first control circuit, a selector circuit and a second control circuit. In an optical amplifier for amplifying a light signal input to an optical amplifier fiber by exciting the optical amplifier fiber with an excitation light, the first control circuit amplifies the difference between a first predetermined voltage and an o/e-converted voltage of an output light of the optical amplifier (or a voltage into which an output light of the optical amplifier is optical-to-electric converted). The selector circuit detects a change in the output voltage of the first control circuit and depending on the change, selectively outputs the output voltage of the first control circuit or a second predetermined voltage. The second control circuit amplifies the difference between the output of the selector circuit, and the o/e-converted voltage of the excitation light and controls the excitation light based on the amplified voltage.

Thus, when the input light is cut off, the optical amplifier of the present invention detects a change in the output voltage of the first control circuit, supplies the second constant voltage to the second control circuit and supplies a constant driving current to the excitation light source. When the input light is normal, the optical amplifier detects a change in the output voltage of the first control circuit, supplies the output of the first control circuit to the second control circuit and supplies to the excitation light source a driving current required to keep the optical amplifier output light level constant. Therefore, the optical amplifier can suppress the excitation light source output light at the input light cut-off time and also keep the excitation light source output level constant.

The second aspect of the present invention provides a first control circuit, a second control circuit and a selector circuit. In an optical amplifier for amplifying a light signal input to an optical amplifier fiber by exciting the optical amplifier fiber with an excitation light, the first control circuit amplifies the difference between a first predetermined voltage and an o/e-converted voltage of an output light of the optical amplifier fiber. The second control circuit amplifies the difference between the o/e-converted voltage of the excitation light and a selected one of the first control circuit output and a second predetermined voltage and controls the excitation light based on the amplified voltage. The selector circuit detects a change in the output voltage of the first and second control circuits and depending on the change, selectively outputs the output voltage of the first control circuit or the second predetermined voltage.

Thus, when the input light is cut off, the optical amplifier of the present invention detects a change in the output voltage of the first control circuit, supplies the second constant voltage to the second control circuit and supplies a constant driving current to the excitation light source. Also, the optical amplifier detects that the input light is normal by a change in the output voltage of the first control circuit, supplies the output of the first control circuit to the second control circuit and supplies to the excitation light source a driving current required to keep the optical amplifier output level constant. Therefore, the optical amplifier can suppress the output of the excitation light source at the input light cut-off time and also keep the excitation light source output level constant.

The third aspect of the present invention sets, in the first and second aspects of the present invention, the second constant voltage to be a voltage which can reduce the excitation light strength to a predetermined level. Thus, the optical amplifier of the present invention can prevent the optical amplifier fiber from generating a light surge when the input light recovers from the cut-off state by supplying the second constant voltage to the second amplifier when the input light is cut off.

BRIEF DESCRIPTION OF THE DRAWINGS

Throughout the above-mentioned drawings, identical reference numerals are used to designate the same or similar component parts.

DESCRIPTION OF THE PREFERRED EMBODIMENTS

Figure 6:
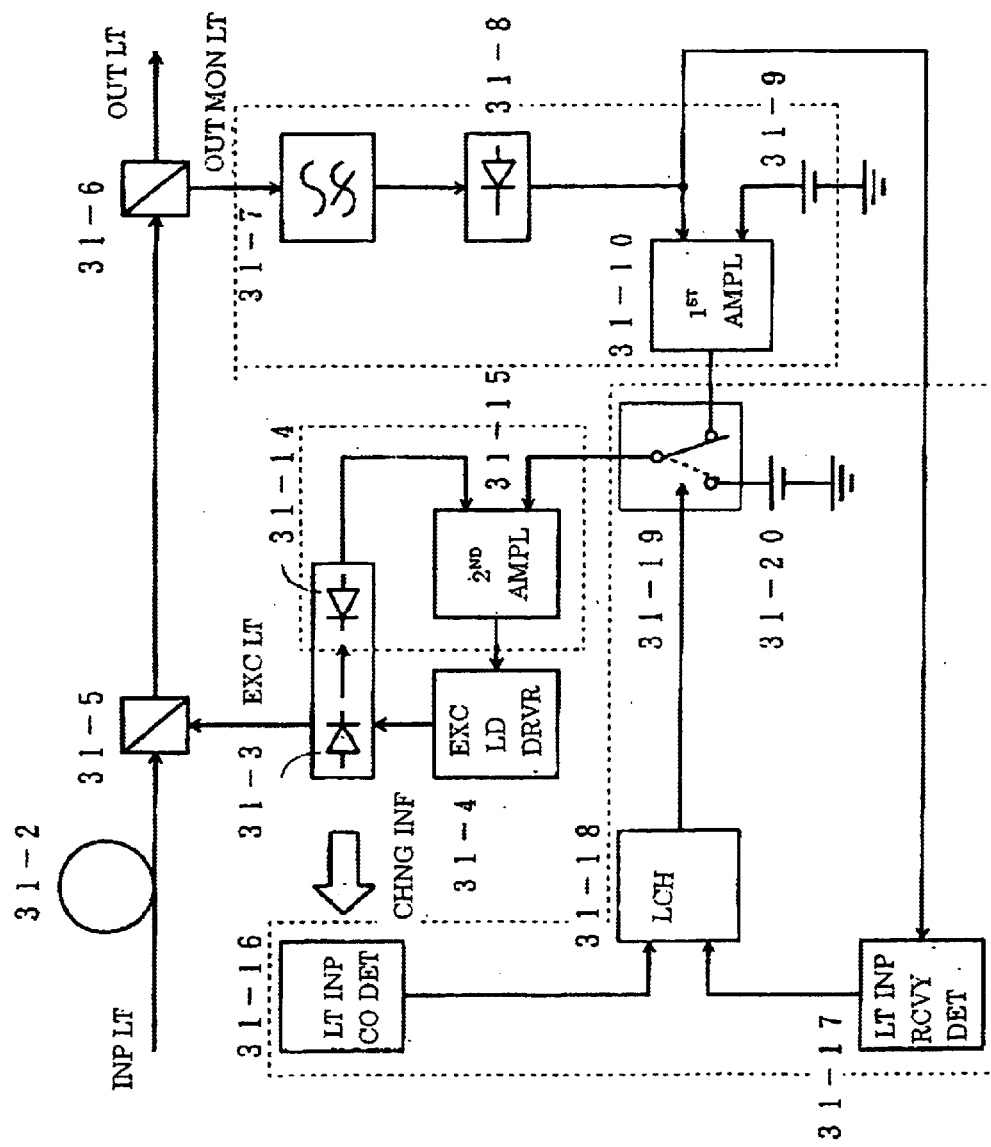
FIG. 6 shows a fundamental circuit configuration of an optical amplifier of the present invention.

The present invention is detailed using the drawings. FIG. 6 shows a fundamental circuit configuration of an optical amplifier of the present invention. In FIG. 6, reference 31-2 is an optical amplifier medium (hereinafter called optical amplifier fiber) for amplifying the input light. 31-3 is an excitation laser diode for generating a excitation light to be supplied to the optical amplifier fiber 31-2.

The excitation laser diode is taken here as an example to supply the excitation light to the optical amplifier fiber. However, the excitation light source is not necessarily restricted to the excitation laser diode, but it can be any device which can generate the light of a wavelength suited to excite an optical amplifier fiber. Since the excitation laser diode is usually used as an excitation light source in the field, the explanation follows using the excitation laser diode.

31-4 is an excitation laser diode driver for supplying a driving current to the excitation laser diode 31-3. 31-5 is a coupler for coupling the excitation light of the excitation laser diode 31-3 with the optical amplifier fiber 31-2. 31-6 is a coupler for branching the optical signal amplified by the optical amplifier fiber 31-2 into an output light and an output monitor light. 31-7 is an optical filter for removing the excitation light mixed in the output monitor light. The optical filter 31-7 is shown here as a low-pass filter for the same reasons as already described.

31-8 is an o/e converter for converting the optical signal output of the optical filter 31-7 into an electric signal. 31-9 is a reference voltage source for generating a first constant voltage. 31-10 is a first amplifier for amplifying the difference between the output of the o/e converter 31-8 and a first constant voltage of the reference voltage source 31-9. A first control circuit consisting mainly of the filter 31-7, o/e converter 31-8, reference voltage source 31-9 and first amplifier 31-10, amplifies the difference between the first constant voltage and the an o/e-converted voltage of an optical amplifier output, light (or voltage into which an output light of the optical amplifier is optical-to-electric converted).

31-14 is an o/e converter including a photodiode for converting a part of the output light received from the excitation laser diode 31-3 into an electric signal. The photodiode is supposed here to be mounted within the package of the excitation laser diode 31-3 to receive its back-light. However, it may be a separate photodiode that receives the light into which the coupler branches the excitation light. Nevertheless, it is advantageous to use the one which is mounted within the package of the excitation laser diode 31-3 to receive the back-light of the excitation laser diode 31-3 because it easy to mounted and reduces the cost.

31-15 is a second amplifier which receives at an input terminal, an electric output signal of the o/e converter 31-14 and generates a signal for driving the excitation laser diode 31-3 to be supplied to the excitation laser diode driver 31-4. Thus, the o/e converter 31-14 and the second amplifier 31-15 constitute a second control circuit for amplifying the difference between the output of the first control circuit and a constant voltage of the later-described second constant voltage source.

31-16 is an input light cut-off detector for detecting a cut-off condition meaning that the input light has dropped below a defined level, on receipt of a voltage informing a level change in the optical amplifier fiber output or a level change in the excitation laser diode output, which level changes are indicated by the first and second amplifiers respectively. The voltage informing the level change will be clarified later when the circuit configuration is detailed.

31-17 is an optical input recovery detector for detecting that the input light level has recovered to a normal condition by recognizing that the output signal of the o/e converter 31-8 has recovered to a defined level. 31-18 is a latch circuit for latching the binary signal values outputted by the input light cut-off detector 31-16 and optical input recovery detector 31-17 to output different logical values indicating the input light cut-off and recovery conditions, respectively.

31-20 is a voltage source for generating a second constant voltage. The second constant voltage can control the output light strength of the excitation laser diode below a defined value. That is, it can control the gain of the optical amplifier fiber 31-2 in the input light cut-off condition, to be smaller than that in the normal condition. Also, it can provide the fiber 31-2 with an excitation light for controlling the gain such that the optical input recovery detector 31-17 can easily detect the input light recovery.

Thus, in order to prevent the optical amplifier fiber 31-2 from generating an optical surge when the input light recovers to the normal condition from the cut-off condition, the gain of the optical amplifier fiber 31-2 is controlled in the input light cut-off condition to be smaller than that in the normal condition. Also, since halting the excitation light completely when the input light is in the cut-off condition causes the optical amplifier fiber 31-2 to present a comparatively large loss, it is difficult for the optical input recovery detector 31-17 to detect immoderately that the input light has recovered. In order to prevent this, the second constant voltage is set to a voltage which can provide the fiber 31-2 with an excitation light for controlling the gain such that the input light recovery detector 31-17 can easily detect an input tight recovery.

Figure 5:
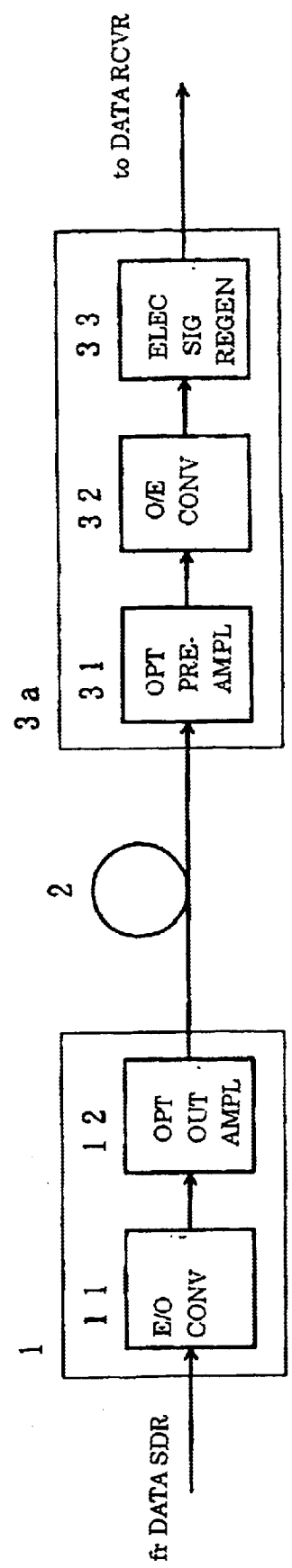
FIG. 5 shows an optical receiver (part 2) in a photonic network.

In more detail, when applying the circuit of FIG. 6 to the optical pre-amplifier 31 in FIG. 5, since the input light level is not so high at the recovery time due to the loss on the optical transmission line, the second constant voltage is required to provide the fiber 31-2 with a gain that allows the recovery to be detected.

Figure 1:
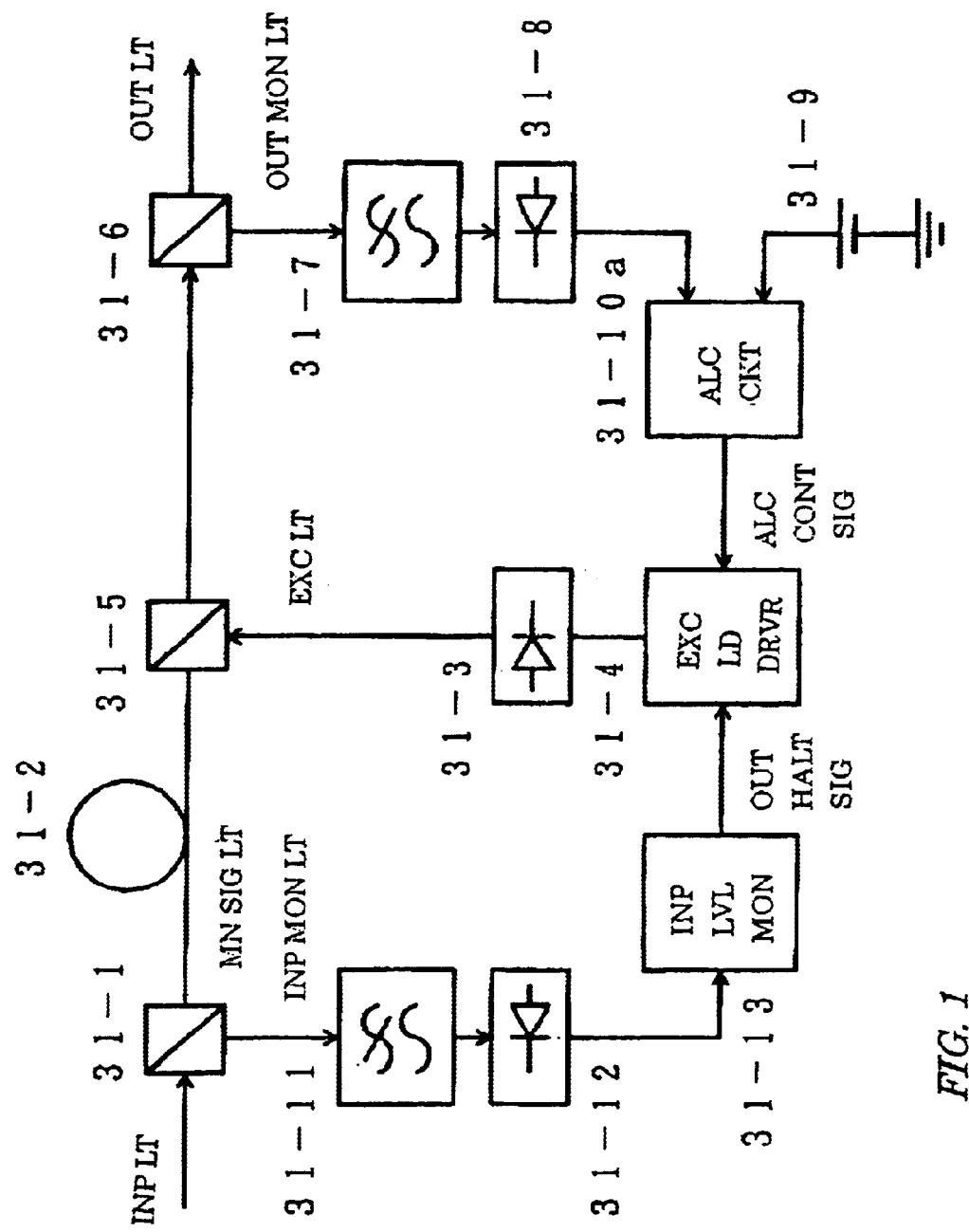
FIG. 1 shows a fundamental circuit configuration of a conventional optical amplifier.
Figure 2:
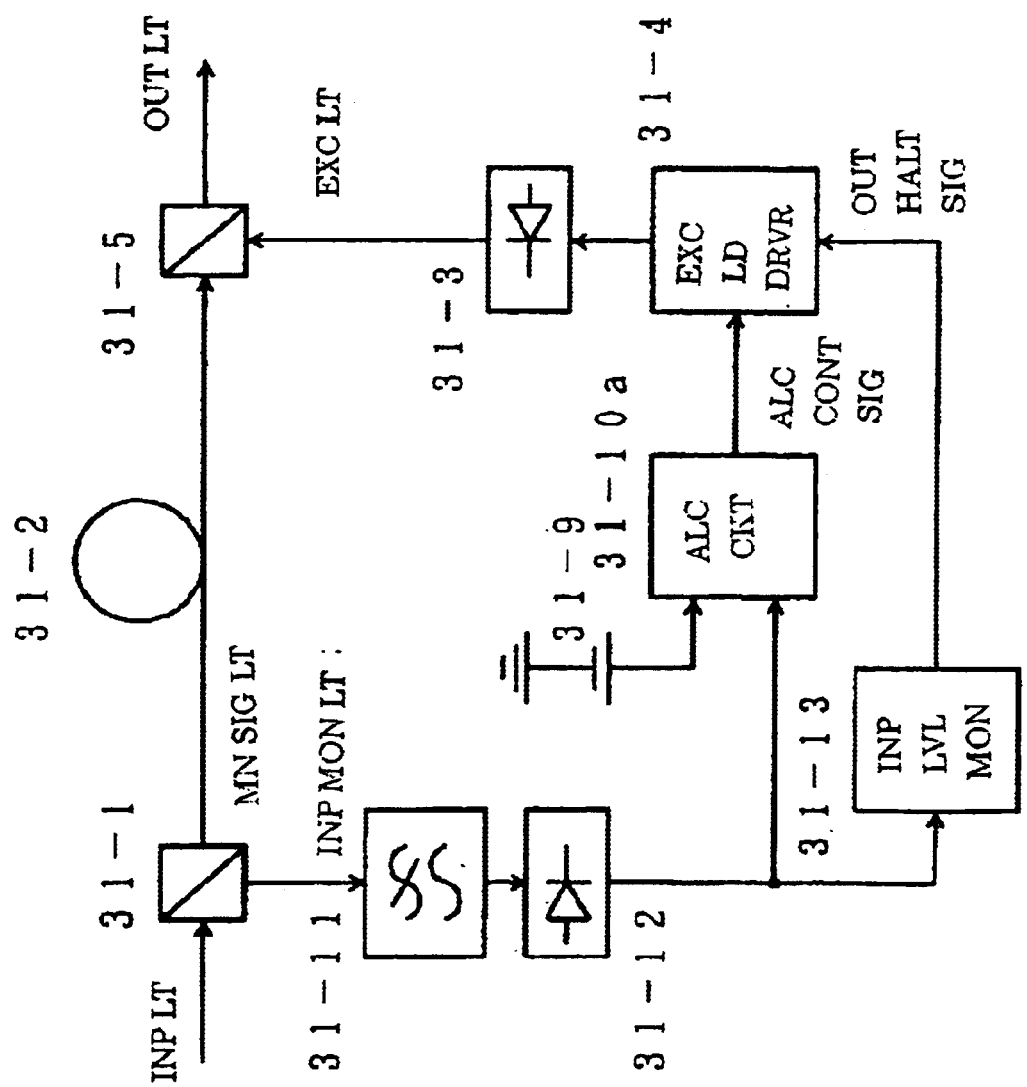
FIG. 2 shows a fundamental circuit configuration of a conventional forward-controlled optical amplifier.
Figure 3:
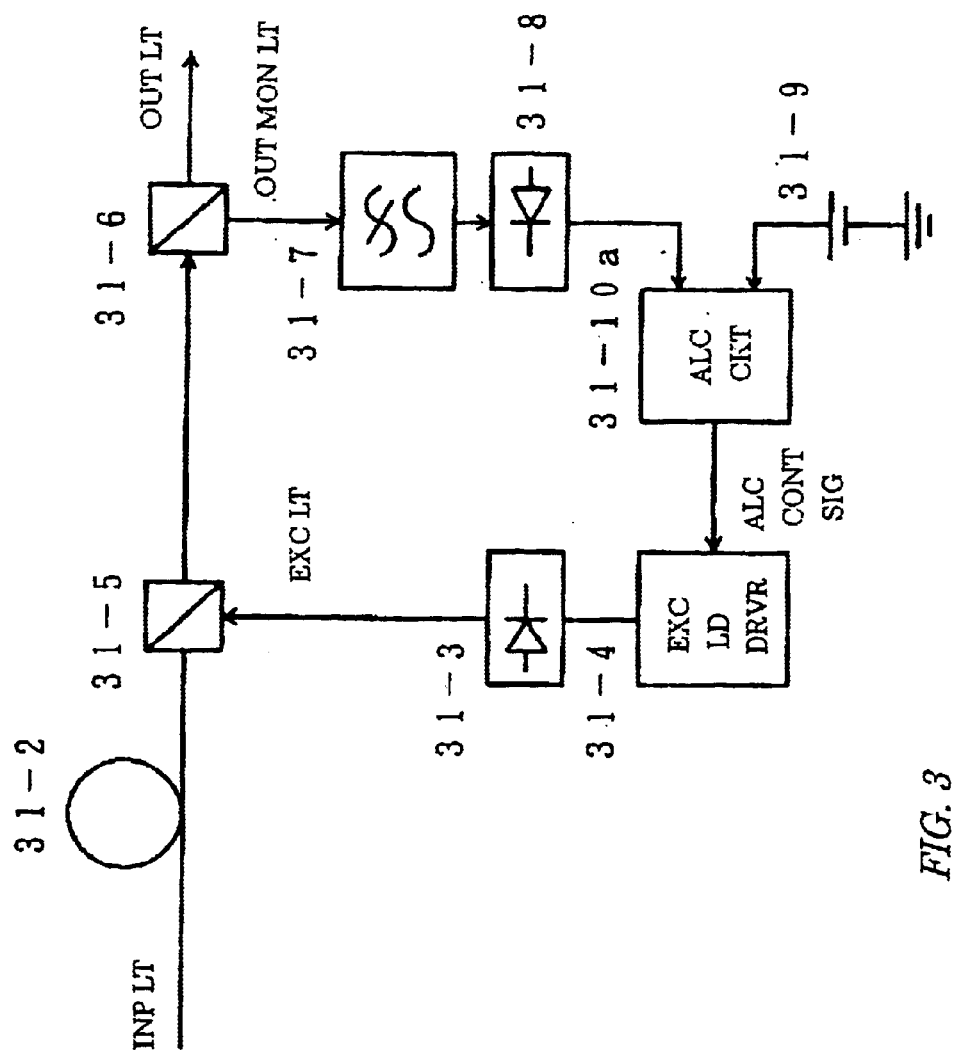
FIG. 3 shows a fundamental circuit configuration of a conventional backward-controlled optical amplifier.
Figure 4:
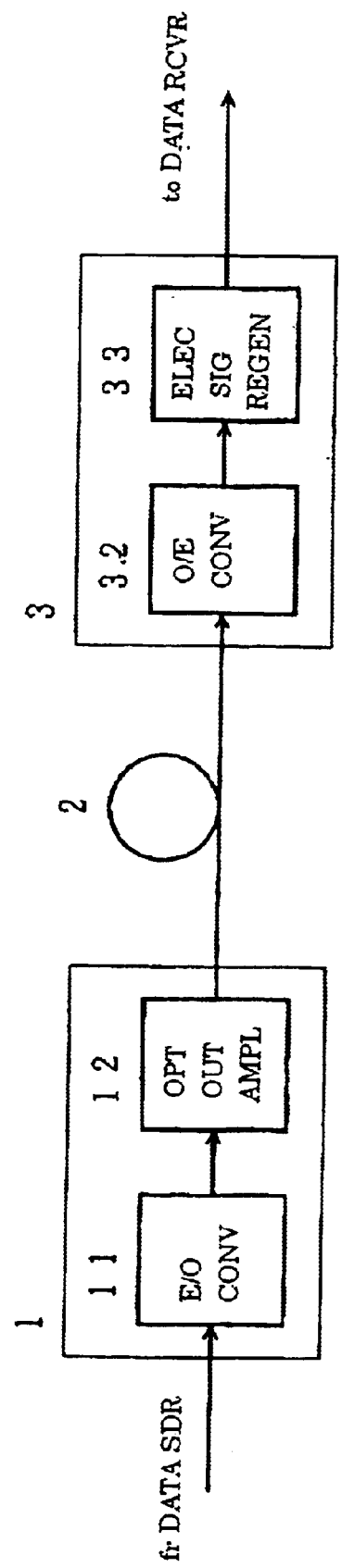
FIG. 4 shows an optical receiver (part 1) in a photonic network.

Meanwhile, when applying the circuit of FIG. 6 to the optical output amplifier 12 in FIGS. 4 and 5, since the input light level is high at the recovery time (because the output of the e/o converter is high enough at normal time), the second constant voltage is required to provide the fiber 31-2 with a gain that allows the recovery to be detected. In other words, the output voltage of the voltage source 31-20 suppresses the excitation light of the excitation laser diode 31-3 and substantially shuts down the excitation laser diode 31-3.

31-19 is an analog switch for supplying to the other terminal of the second amplifier 31-15, either one of the outputs of the first amplifier 31-10 and the voltage source 31-20 depending on the output of the latch circuit 31-18. In more detail, the analog switch 31-19 supplies the output of the voltage source 31-20 to one of the input terminals of the second amplifier 31-15, based a logical level to which the latch 31-18 is set by the output of the light input cut-off detector 31-16. Also, the analog switch 31-19 supplies the output of the first amplifier 31-10 to the aforesaid input terminals, based on the other logical level to which the latch 31-18 is set by the output of the light input recovery detector 31-17. Thus, the light input cut-off detector 31-16, light input recovery detector 31-17, latch 31-18, analog switch 31-19 and voltage source 31-20 constitute a switch controller, which selects either of the output of the first amplifier 31-10 and the second constant voltage to supply to the second amplifier 31-15.

Here, it is necessary to determine the amplification polarity of the first and second amplifiers 31-10 and 31-15 as follows. That is, if the first amplifier 31-10 is an inverting amplifier for the output of the o/e converter 31-8, the second amplifier 31-15 is to be a non-inverting amplifier for the output of the analog switch 31-19.

Thus, when the analog switch 31-19 selects the output of the first amplifier 31-10 to supply the selected output to the second amplifier 31-15, the loop starting from and ending with the o/e converter 31-8 through the first and second amplifiers 31-10 and 31-15, excitation laser diode driver 31-4, excitation laser diode 31-3, couplers 31-5 and 31-6 and filter 31-7 forms a negative feedback loop to control the output light at a constant level.

In the above relationship, the first amplifier 31-10 can amplify the difference between the output of the o/e converter 31-8 and the first constant voltage. The second amplifier 31-15 can amplify the difference between the output voltage of the analog switch 31-19 and the voltage into which the o/e converter 31-14 has converted the excitation light strength.

Further, if the first amplifier 31-10 is a non-inverting amplifier for the output of the o/e converter 31-8, the second amplifier 31-15 may be an inverting amplifier for the output of the analog switch 31-19, for the following reasons. Even when the analog switch 31-19 selects the output of the first amplifier 31-10 to supply to the second amplifier 31-15, the aforesaid negative feedback loop is formed so as to control the output light at a constant level. In this case, too, the first amplifier 31-10 can amplify the difference between the output of the o/e converter 31-8 and the first constant voltage. Then, the second amplifier 31-15 can amplify the difference between the output voltage of the analog switch 31-19 and the voltage into which the o/e converter 31-14 has converted the excitation light strength.

In summary, the circuit in FIG. 6 comprises a first amplifier 31-10 for amplifying the difference between the first constant voltage and the o/e-converted voltage of the output light of the optical amplifier fiber 31-2, a second amplifier 31-15 for amplifying the difference between either the output voltage of the first amplifier 31-10 or the second constant voltage and the o/e-converted voltage of the excitation light strength, and a switch for detecting a change in the output voltage of the first amplifier 31-10 and depending on the change, supplying to the second amplifier 31-15, the output of the first amplifier 31-10 or the second constant voltage.

Then, when the level of the input light is normal, the output of the first amplifier 31-10 is supplied to the second amplifier 31-15, in which the difference from the output of the o/e converter 31-14 is amplified and supplied to the excitation laser diode driver 31-4 so that an automatic level control is performed to keep the output level constant. When the level is in a cut-off condition, the second constant voltage is supplied to the second amplifier 31-15, in which the difference from the output of the o/e converter 31-14 is amplified and supplied to the excitation laser diode driver 31-4. Thus, the gain of the optical amplifier fiber 31-2 is controlled such that the gain in an input light cut-off condition is smaller than that in the normal condition and the optical input recovery detector circuit 31-17 can easily detect that the input light has recovered.

Thus, even if the characteristic of the excitation laser diode 31-3 changes due to the ambient temperature and aging when the level of the input light is normal, the level of the output light of the optical amplifier fiber 31-2 can be kept constant since the level of the excitation light is controlled according to the level of the input light.

Further, when an input light cut-off condition is detected meaning that the input light level has dropped below a defined level and the voltage informing a change in the output level of the optical amplifier fiber is received from the first amplifier or the voltage informing an output change of the excitation laser diode is received from the second amplifier, the second constant voltage is supplied to the second amplifier 31-15. Then, the gain of the optical amplifier fiber 31-2 is controlled such that the gain in an input light cut-off condition is smaller than that in the normal condition and the optical input recovery detector circuit 31-17 can easily detect that the in put light has recovered. Thus, the optical amplifier fiber 31-2 can be prevented from generating a surge when the input light recovers to the normal level. Furthermore, since the second constant voltage is set as aforesaid, an input light recovery can be detected immediately and the automatic level control of the output light can be resumed immediately.

Figure 7:
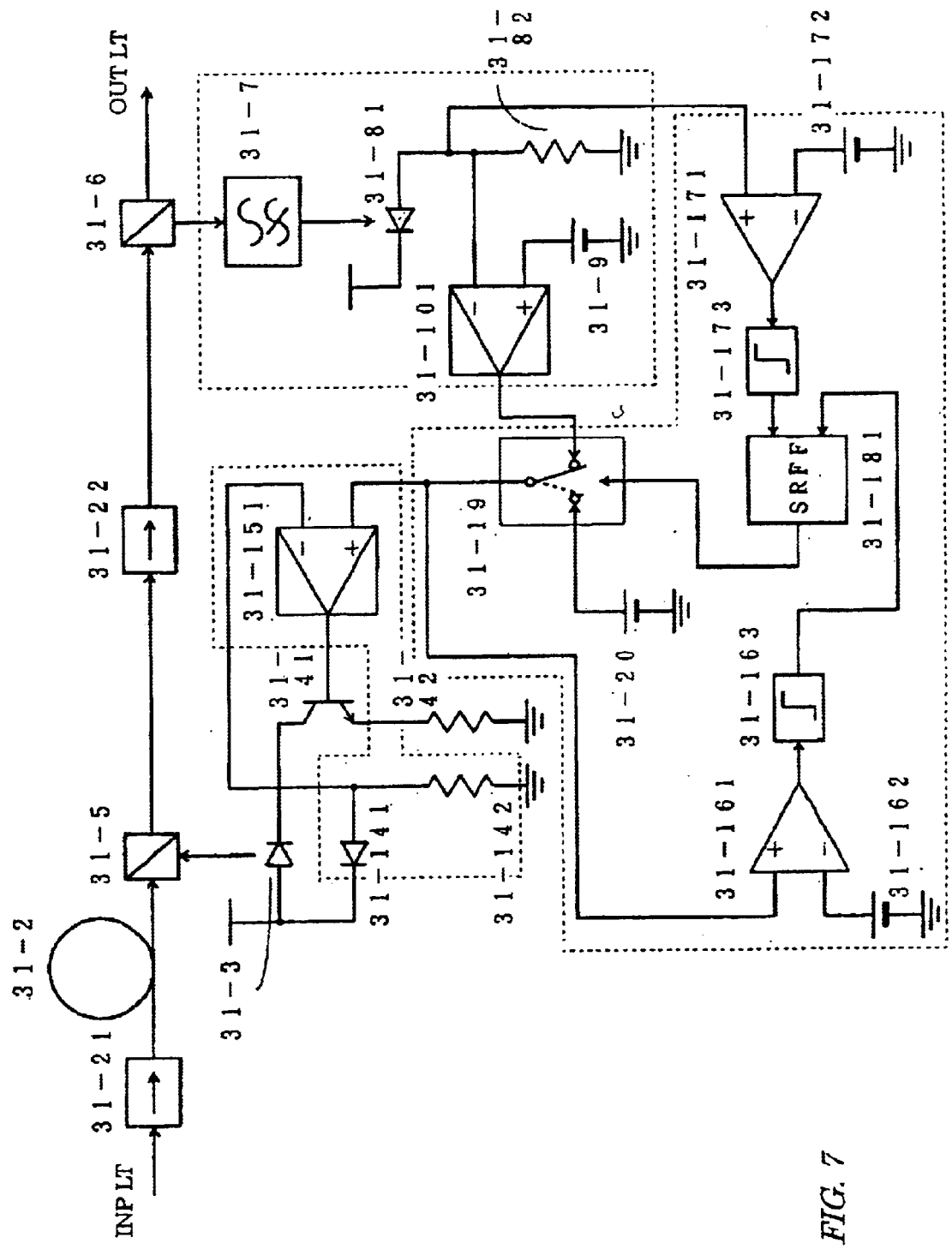
FIG. 7 shows the first embodiment of an optical amplifier of the present invention.

A detailed explanation of the embodiment and operations of the present invention follows using the timing charts. FIG. 7 shows the first embodiment of an optical amplifier of the present invention. In FIG. 7, reference 31-2 is an optical amplifier fiber for amplifying an input light. 31-3 is an excitation laser diode for generating an excitation light to be supplied to the optical amplifier fiber 31-2.

31-41 is a transistor for supplying a driving current to the excitation laser diode 31-3. 31-42 is a resistor for restricting the current of the transistor 31-41. The transistors 31-41 and 31-42 constitute the excitation laser diode driver 31-4 shown in FIG. 6. 31-5 is a coupler for supplying the excitation light of the excitation laser diode 31-3 to the optical amplifier fiber 31-2. 31-6 is a coupler for branching the light amplified by the optical amplifier fiber into an output light and an output monitor light. 31-7 is an optical filter for removing the excitation light which is mixed in the output monitor light.

In FIG. 7, the optical filter 31-7 is illustrated as a low-pass optical filter for the aforesaid reasons. 31-81 is a photodiode for converting the optical signal output by the optical filter 31-7 into an electric signal. 31-82 is a resistor for converting the o/e-converted current into a voltage. The photodiode 31-81 and the resistor 31-82 constitute the o/e converter 31-8 shown in FIG. 6.

31-9 is a reference voltage source for generating a first constant voltage. 31-101 is a differential amplifier for amplifying the difference between the voltage across the resistor 31-82 and the first constant voltage output of the reference voltage source 31-9. The differential amplifier forms the first amplifier 31-10 in FIG. 6. A first control circuit composed mainly of the filter 31-7, photodiode 31-81, resistor 431-82, reference voltage source 31-9 and differential amplifier 31-101, amplifies the difference between the first constant voltage and the o/e-converted voltage of the output light of the optical amplifier fiber 31-2.

31-141 is a photodiode for converting a part of the output light received from the excitation laser diode 31-3 into an electric signal. 31-142 is a resistor for converting the o/e-converted current into a voltage. The photodiode 31-141 and the resistor 31-142 constitute the o/e converter 31-14 shown in FIG. 6. The photodiode 31-141 is supposed to be mounted within the package of the excitation laser diode 31-3 to receive a back-light of the excitation laser diode 31-3. However, it may be a separate photodiode as explained above.

31-151 is a differential amplifier forming a second amplifier 31-15 shown in FIG. 6, which on receipt of the voltage across the resistor 31-142 at the inverting input terminal and either the output of the differential amplifier 31-101 or the second constant voltage (described later) at the non-inverting input terminal, supplies a signal for driving the excitation laser diode 31-3 to the excitation laser diode driver 31-4.

31-162 is a reference voltage source. 31-161 is a comparator for comparing a signal (i.e., one of the aforesaid voltages indicating the level change via the first control circuit) supplied to the non-inverting input terminal of the differential amplifier 31-151 with the reference voltage of the reference voltage source 31-162. As a result of comparison, when the former is larger than the latter by a defined voltage or more, the comparator 31-161 outputs a logical 1. 31-163 is an edge detector for detecting a leading edge of the output of the comparator 31-161. The comparator 31-161, reference voltage source 31-162 and edge detector 31-163 constitute the light input cut-off detector 31-16 shown in FIG. 6.

31-172 is a reference voltage source. 31-161 is a comparator for comparing the voltage across the resistor 31-82 with the reference voltage of the reference voltage source 31-172 and when the former is larger than the latter by a defined voltage or more, outputs a logical 1. 31-173 is an edge detector for detecting a leading edge of the output of comparator 31-171. The comparator 31-171, reference voltage source 31-172 and edge detector 31-163 constitute the light input recovery detector 31-16 shown in FIG. 6.

31-20 is a voltage source for generating a second constant voltage. 31-19 is an analog switch for selecting either the second constant voltage or the output of the differential amplifier 31-101 to supply to the non-inverting input terminal of the differential amplifier 31-151. 31-181 is a set reset flip-flop (abbreviated to SRFF in the figure), which is set by the output of edge detector 31-163 and outputs either one of the logical levels depending on the input light being cut-off or normal (or recovered), thus forming the latch shown in FIG. 6.

The differential amplifier 31-151, photodiode 31-141 and resistor 31-142 constitute a second control circuit for amplifying the difference between either the first control circuit output or the second constant voltage and the o/e-converted voltage of the excitation light strength. Also, the aforesaid light input cut-off detector, light input recovery detector, set reset flip-flop 31-181, voltage source 31-20 and analog switch 31-19 constitute a switch controller.

The second constant voltage generated by the voltage source 31-20 prevents the gain of optical amplifier fiber 31-2 becoming too small when the input light is cut-off and provides the optical amplifier fiber 31-2 with an excitation light that can control the gain to allow the light input recovery detector to detect immediately when the input light recovers. To be more concrete, when the circuit in FIG. 6 is applied to the pre-amplifier 31 in FIG. 5, since the level of the input light at the recovery time is not so high, the second constant voltage is required to provide the optical amplifier fiber 31-2 with a gain large enough for the detector to detect the recovery.

Meanwhile, when the circuit in FIG. 6 is applied to the light output amplifier 12 in FIGS. 4 and 5, since the level of the input light at the recovery time is high, the optical amplifier fiber 31-2 may yield a loss, causing the second constant voltage to halt the excitation laser diode 31-3. When the input light is normal, the analog switch 31-19 supplies the output of the differential amplifier 31-101 to the non-inverting input terminal of the differential amplifier 31-151. When the input light is cut off, the differential amplifier attempts to raise its output voltage to keep the output light level constant.

Therefore, the input light cut-off condition can be detected by comparing the voltage at the non-inverting input terminal of the differential amplifier 31-151 with the output voltage of the reference voltage source 31-162. That is, the comparator 31-161 changes its output from logical "0" to logical "1" on detecting the aforesaid voltage rise. Then, the edge detector 31-163 detects an edge of the change and outputs logical "1" to the reset terminal of the set reset flip-flop. Thus, the analog switch 31-19 connects to the voltage source 31-20 to supply the second constant voltage of the voltage source 31-20 to the non-inverting input terminal of the differential amplifier 31-151. Therefore, the automatic level control loop is opened to restrain the output light strength of the excitation laser diode 31-3, since the voltage of the voltage source 31-20 is set as aforesaid.

In this condition, when the input light recovers, the output-light monitor signal which is the voltage across the resistor 31-82 may be higher than a defined voltage since the output voltage of the voltage source 31-20 is set as aforesaid, and the comparator 31-171 and the edge detector 31-173 can detect an input-light recovery.

Then, since the set reset flipflop 31-181 is set by the output of the edge detector 31-173, the analog switch 31-19 selects the output of the differential amplifier 31-101 to supply to the non-inverting input terminal of the differential amplifier 31-151. Thus, a negative feedback loop for performing the automatic level control is formed again to keep the output light level constant. That is, the circuit in FIG. 7 can perform the automatic level control and restrain the output light of the excitation laser diode 31-3 in the input-light cut-off state at the same time.

Figure 8:
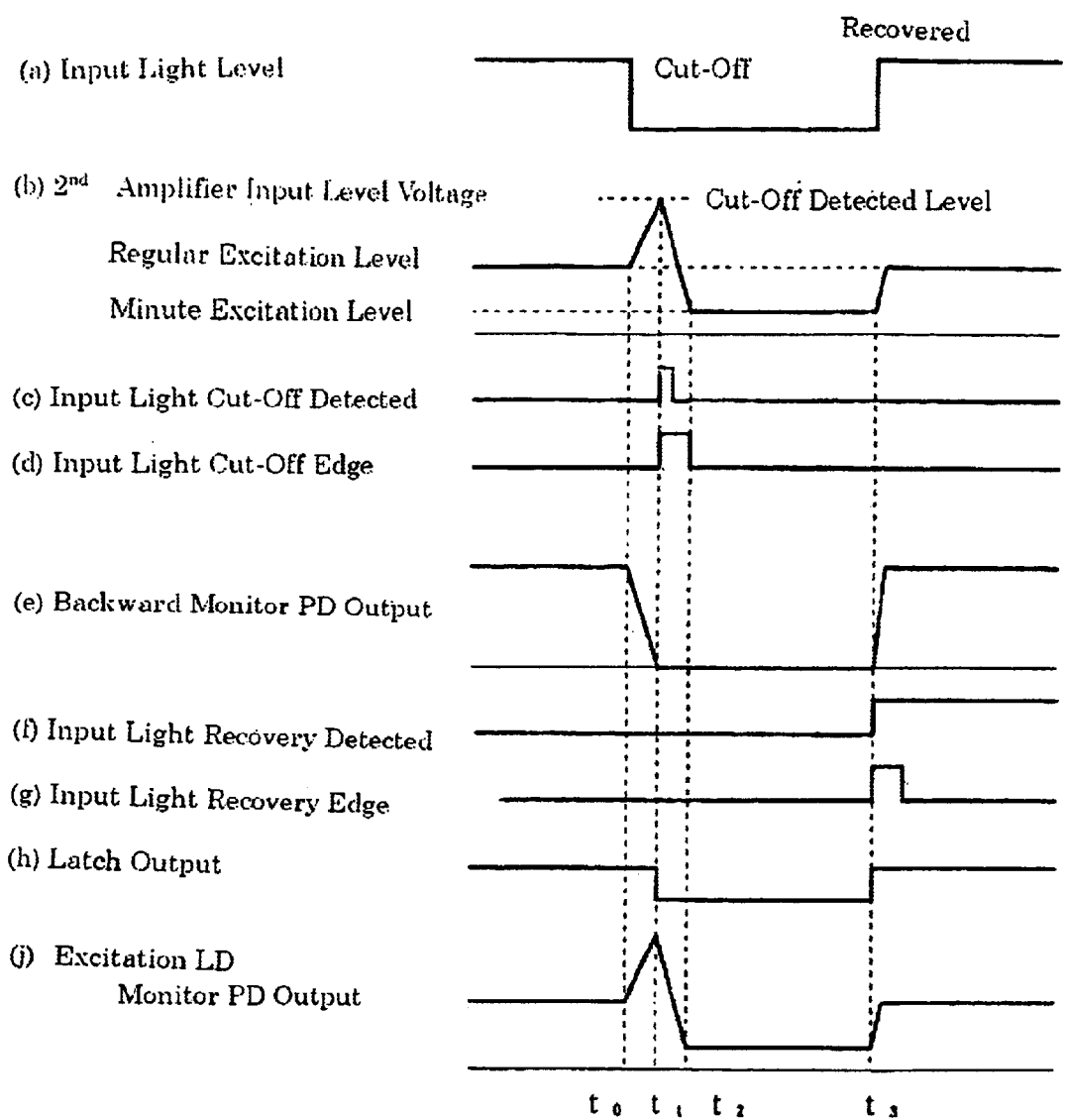
FIG. 8 is a timing chart illustrating the input light cut-off and recovery operations of the optical amplifier in FIG. 7.

FIG. 8 is a timing chart illustrating the input-light cut-off and recovery operations of the optical amplifier in FIG. 7. The explanation follows based on FIG. 8, referring to FIG. 7. In FIG. 8, (a) shows the input-light level, in which the level is cut off at time t0 and recovers at t3. (b) shows the voltage (shown in FIG. 8 as second amplifier input voltage) supplied to the non-inverting input terminal of the differential amplifier 31-151 of FIG. 7.

When the input light is in the normal level (on or before t0), the voltage at the non-inverting input terminal of the differential amplifier 31-15 corresponds to the regular excitation level. When the input light is cut off in this condition, the output-light level drops and also the voltage supplied to the inverting input terminal of the differential amplifier 31-101 drops. As a result, the voltage level of the automatic level control signal output of the differential amplifier 31-101 rises and also the output voltage of the analog switch 31-19 rises.

Since the comparator 31-161 compares the output voltage of the analog switch 31-19 with that of the reference voltage source 31-162, the input light cut-off is detected when the voltage (b) rises by a defined level or higher from the regular excitation level, i.e., at time t1. The expression "rises by a defined level or higher from the regular excitation level" means "rises higher than the regular excitation level corresponding to a probable change that can usually occur in the input-light strength". This is shown in (c), which is a waveform of the output of the comparator 31-161.

(d) is a signal showing the leading edge of the cut-off input light, i.e., the output of the edge detector 31-16 in FIG. 7. The edge detector 31-163 is used for the following reasons: When the input light cut-off is detected, the analog switch 31-19 selects the output of the voltage source 31-20 to apply a certain voltage level to the non-inverting input terminal of the differential amplifier 31-151. Then, as the voltage at the non-inverting input terminal drops to a minute excitation level as shown in (b), the pulse width of the waveform (c) narrows, making it difficult to detect the input light cut-off precisely. Therefore, the edge detector 31-163 is used to obtain a desired pulse width.

Since the set-reset flipflop 31-181 in FIG. 7 is reset by the output of the edge detector 31-163 whose waveform is shown in (d), the output of the flipflop 31-181 change to logical "0" as shown in (h) to supply the second constant voltage to the non-inverting input terminal of the differential amplifier 31-151 at time t2. This causes the excitation level of the optical amplifier fiber 31-2 to drop to a level as shown in (b) as "minute excitation level".

Meanwhile, in response to an input light cut-off, the output of the photodiode 31-81 for the backward monitoring drops as shown in (e) and the output of the photodiode, which monitors the excitation laser diode 31-3, changes as shown in (i). That is, despite an input light cut-off, the excitation light of the excitation laser diode 31-3 does not increase and the reliability of the excitation laser diode 31-3 can be secured. In this condition, on detecting that the input light recovery (at t3), the comparator 31-171 in FIG. 7 outputs logical "1" as shown in (f) to cause the edge detector 31-173 to output a signal of a certain pulse width as shown in (g). As the set-reset flipflop 31-181 of FIG. 7 is set by the pulse (g), the output of the flipflop 31-181 returns to logical "1" as shown in (h).

Thus, the analog switch 31-19 selects the output of the differential 31-101 to supply to non-inverting input terminal of the differential amplifier 31-151. Then, the circuit of FIG. 7 resumes the automatic level control operation to cause the voltage supplied to non-inverting input terminal of the differential amplifier 31-151 to remain at the regular excitation level at t3 and after, as shown in (b). At the same time, the output (see (e)) of the photodiode 31-81 for the backward monitoring and also the output (see (i)) of the photodiode 31-41 for monitoring the excitation laser diode return to a constant, level corresponding to the regular excitation level. Since the signal informing of an input light recovery detected is held in logical "1" as in (f), the edge detector 31-173 is not necessarily required.

In the circuit in FIG. 7, a feedback loop including the differential amplifier 31-151 for the second control circuit exists as a minor loop in the aforesaid negative feedback loop for the automatic level control with the first and second control circuits included. With the thus-constructed circuit, if the response time of the feedback loop including the differential amplifier 31-151 is longer than that of the feedback loop for the automatic level control, an oscillation may occur in the feedback loop for the automatic level control due to a possible disagreement in control operation between the second and first control circuits.

To prevent this, it is necessary to make the response time of the second control circuit shorter than that of the first control circuit. For example, it will be sufficient that the response time of the second control circuit is about 1/10 that of the first control circuit. The same is true with the following embodiments.

Furthermore, it is described above that an input light cut-off is determined by recognizing the output of the differential amplifier 31-101 increase. This is because the circuit is constructed such that the output monitor signal into which the output monitor light is o/e-converted is supplied to the inverting input terminal of the differential amplifier 31-101 and the output of the differential amplifier 31-101 is supplied to the non-inverting input terminal of the differential amplifier 31-151 to control the driving current of the excitation laser diode 31-3.

However, the circuit may be constructed such that the signal into which the output monitor light is o/e-converted is supplied to the non-inverting input terminal of the differential amplifier 31-101 and the automatic level control signal, which is the output of the differential amplifier 31-101, is supplied to the inverting input terminal of the differential amplifier 31-151 to control the driving current of the excitation laser diode 31-3. In the latter circuit, an input light cut-off is determined by detecting the automatic level control signal drop.

In the above description, an example is taken in which an input light cut-off is detected by recognizing that the input of the differential amplifier 31-151 makes a defined change. However, it may be detected by recognizing that the output monitor signal or the output of the differential amplifier 31-101 makes a defined change. Or, it may be detected by recognizing that the output of the differential amplifier 31-151 makes a defined change.

Note that a change in the output monitor signal and a change in the output of the differential amplifier 31-101 are each factors of the change information for the first control circuit, and a change in the input of the differential amplifier 31-151 and a change in the output of the differential amplifier 31-151 are each factors of the change information for the second control circuit. More than one factor of the change information may be used in detecting the input light cut-off.

That is, the input light cut-off may be detected by recognizing plural factors of the change information and determined by a logical add or a majority rule.

The input light cut-off may be detected using the level change information either via the first or second control circuit. However, note that after an input light cut-off is detected, the first control circuit is disconnected from the negative feedback loop for the automatic level control by the analog switch 31-19 and therefore, the input recovery must be detected by the change information for the first control circuit.

That is, the embodiment shown in FIG. 7 includes two aspects. The optical amplifier of the first aspect comprises a first control circuit which amplifies the difference between the o/e-converted voltage of the output light strength of the optical amplifier fiber and the first constant voltage, a second control circuit which compress-amplifies the difference between either the output of the first control circuit or the second constant voltage and the o/e-converted voltage of the excitation light strength, and a switch controller which detects a change in the output voltage of the first control circuit and depending on the change, supplies the output of the first control circuit or the second constant voltage to the second control circuit.

The optical amplifier of the second aspect comprises a first control circuit which amplifies the difference between the o/e-converted voltage of the output light strength of the optical amplifier fiber and the first constant voltage, a second control circuit which amplifies the difference between either the output voltage of the first control circuit or the second constant voltage and the o/e-converted voltage of the excitation light strength, and a switch controller which detects a change in the output voltage of the first and second control circuits and depending on the change, supplies the output of the first control circuit or the second constant voltage to the second control circuit.

Further in the circuit in FIG. 7, the switch signal supplied to the switch 31-19 is held at a logical level by a signal indicating that the voltage at the non-inverting input terminal of the differential amplifier 31-151 has made a defined change. The switch signal is also held at other logical level by a signal indicating that the output monitor signal into which the output monitor light is o/e-converted (i.e., the voltage at a terminal of the resistor 31-82) has recovered to a defined voltage. Although the set-reset flipflop 31-181 is used here for the latch circuit to hold the switch signal, a J-K flipflop may be used instead of the set-reset flipflop 31-181. It is the same to the following embodiments that a J-K flipflop may be used for the latch circuit.

Also, if the optical amplifier includes a switch controller for detecting a voltage change in the first control circuit output and depending on the change, supplies the output of the first control circuit or the second constant voltage to the second control circuit, the comparator for detecting the change and the edge detector can be used in common for detecting the input cut-off and recovery. In this case, a D-type flipflop (D-FF) may be used for the latch circuit.

Figure 9:
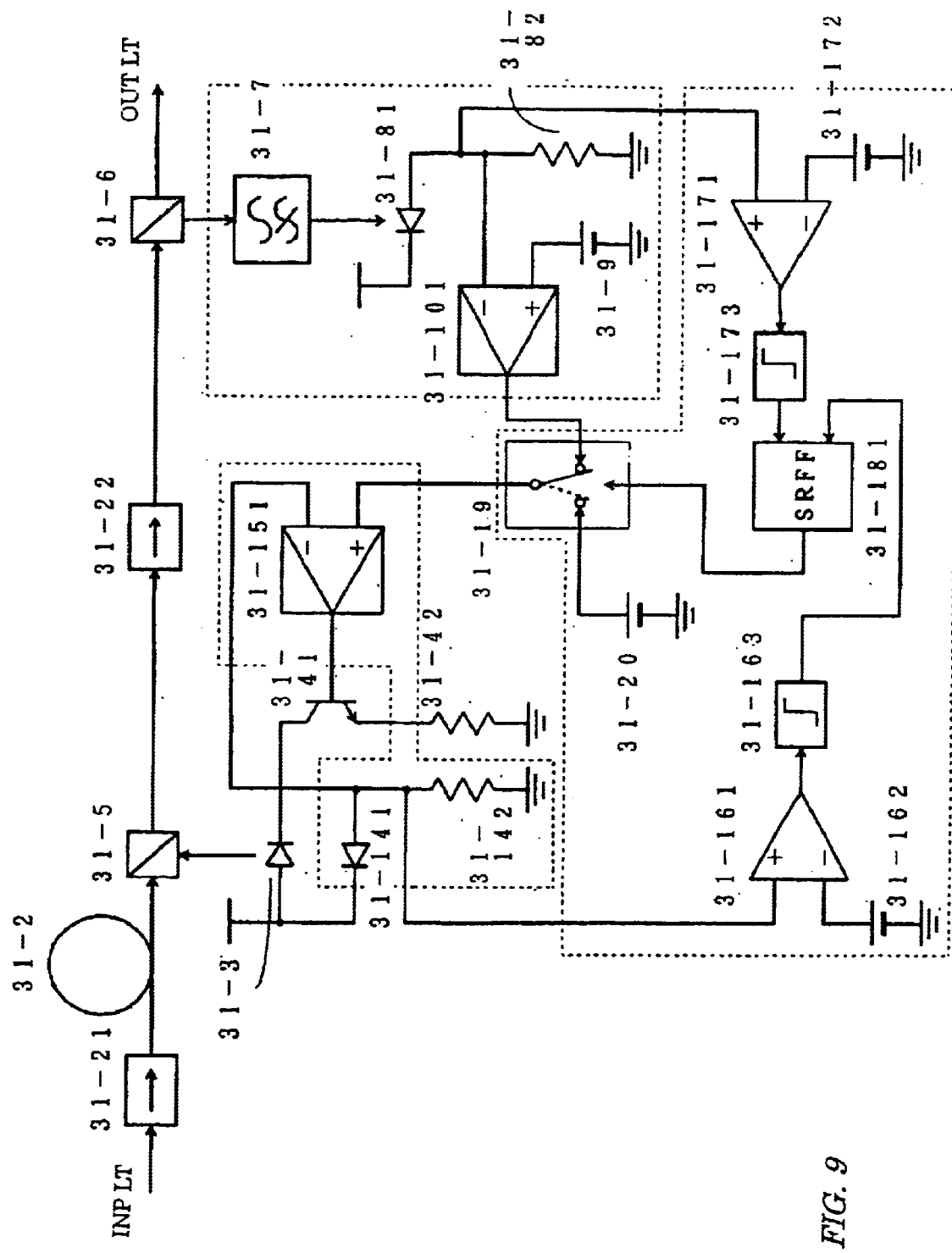
FIG. 9 shows the second embodiment of an optical amplifier of the present invention.

FIG. 9 shows the second embodiment of the present invention. The circuit in FIG. 9 is apparently the same as that in FIG. 7, except that the input to the comparator 31-161 is the output of the photodiode 31-141, i.e., a voltage across the resistor 142. The first and second control circuits and the switch controller are also the same as those in FIG. 7.

The output of the photodiode 31-141 is the excitation laser diode monitor signal for monitoring the output light level of the excitation laser diode 31-3 and is an electric signal into which the light which is proportional to the excitation light strength is o/e-converted. As the output voltage of the differential amplifier 31-101 begins to rise when the input light is cut off, the output level of the photodiode 31-141 begins to rise by means of the differential amplifier 31-151. Thus, the input light cut-off can also be detected based on the output of the photodiode 31-141, i.e., the excitation laser diode monitor signal.

Since the voltage into which the input light was o/e-converted by the photodiode 31-141 rises without fail when the input light is cut off, the input light cut-off can be detected by recognizing the voltage to rise. Also, the circuit for detecting the input-light recovery is the same as that in FIG. 7.

Since the photodiode 31-141 for monitoring the output of the excitation laser diode 31-3 is within the second control circuit, the excitation laser diode monitor signal also indicates a voltage change in the second control circuit output. That is, both circuits in FIGS. 7 and 9 detect in common the input light cut-off by a change in the second control circuit output and the input light recovery by a change in the first control circuit output. It can easily be understood that the circuit in FIG. 9 performs the same operation as that in FIG. 7.

Figure 10:
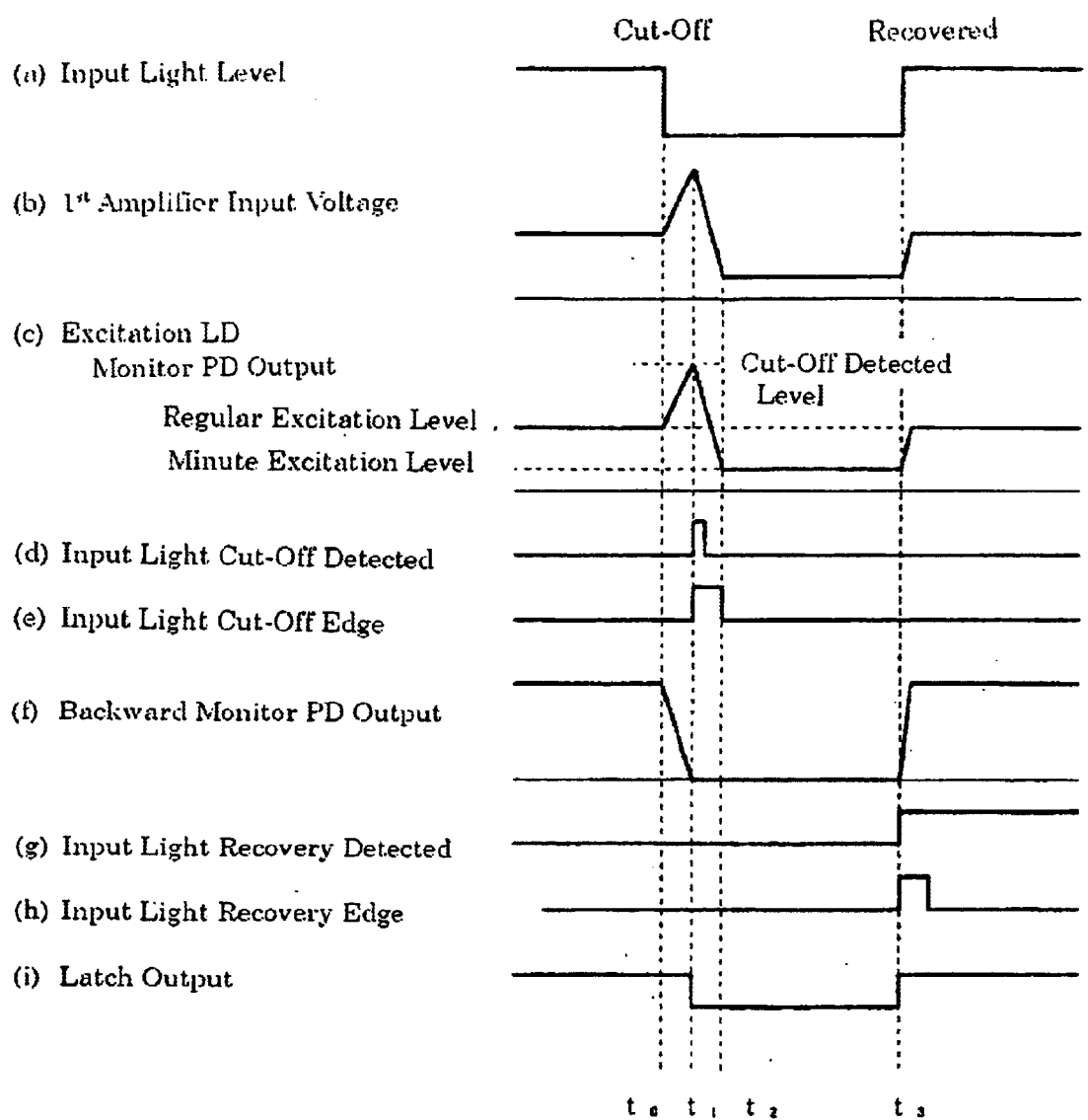
FIG. 10 is a timing chart illustrating the input light cut-off and recovery operations of the optical amplifier in FIG. 9.

FIG. 10 is a timing chart illustrating the input light cut-off and recovery operations of the optical amplifier in FIG. 9. The timing chart of FIG. 10 is the same as that of FIG. 8 except that the input cut-off is detected by the excitation laser diode monitor signal for monitoring the output of the excitation laser diode 31-3, which is also the output of the photodiode 31-141, without need to explain the FIG. 10 timing chart.

Although the circuit in FIG. 9 and the operation in FIG. 10 were almost omitted to explain, note that if the differential amplifier 31-101 is an inverting amplifier responsive to the output of the o/e converter 31-8 (the circuit consisting mainly of the photodiode 31-81 and resistor 31-82, hereinafter represented by 31-8), the differential amplifier 31-151 is a non-inverting amplifier responsive to the output of the analog switch 31-19. If the differential amplifier 31-101 is a non-inverting amplifier responsive to the output of the o/e converter 31-8, the differential amplifier 31-151 is an inverting amplifier responsive to the output of the analog switch 31-19.

Figure 11:
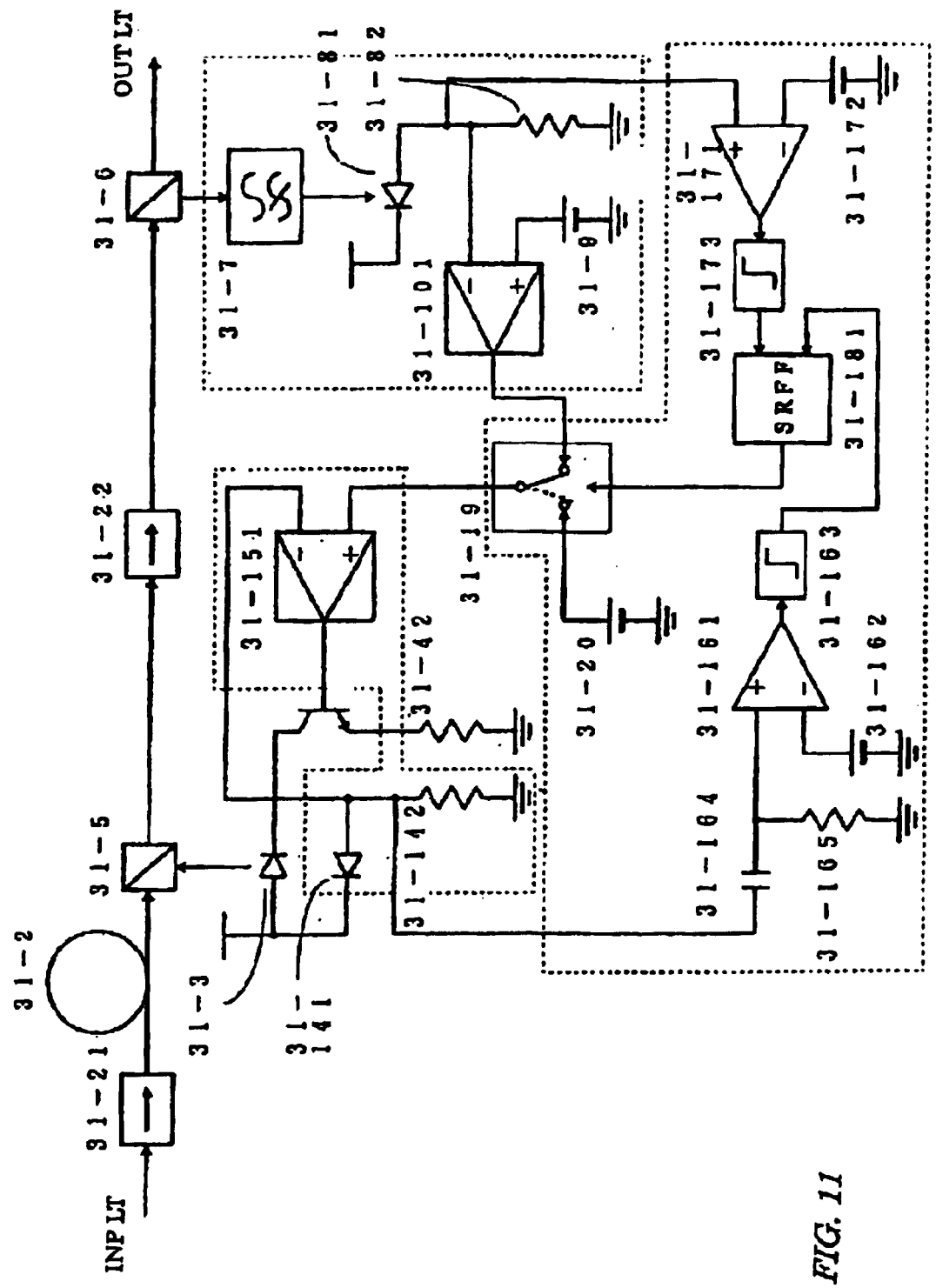
FIG. 11 shows the third embodiment of an optical amplifier of the present invention.

FIG. 11 shows the third embodiment of an optical amplifier of the present invention. The circuit in FIG. 11 is apparently the same as that in FIG. 9, except that a differentiation circuit consisting of a capacitor 31-161 and a resistor 31-165 is inserted between an end of the resistor 31-142 and the non-inverting input terminal of the comparator 31-161 and the voltage across the resistor 31-142 is differentiated to detect a voltage change. Also, the first and second control circuits and the switch controller are the same as those in FIGS. 7 and 9, except that the aforesaid differentiation circuit is added to the switch controller.

The signal obtained by differentiating the output of the photodiode 31-141, which is also a signal obtained by differentiating the o/e-converted voltage of the light that is proportional to the excitation light of the excitation laser diode 31-3, indicates the operating conditions of the excitation laser diode 31-3. Since the changes in the output of the photodiode 31-141 is the same is described using the circuit in FIG. 9, the input light cut-off can be detected by differentiating the output of the photodiode 31-141. The input light recovery is detected in the same way as in FIG. 9. Furthermore, since the photodiode 31-141 for monitoring the output of the excitation laser diode 31-3 is in the second control circuit, the excitation laser diode monitor signal also indicates the level changes via the second control circuit. That is, both circuits in FIGS. 7 and 9 detect in common the input light cut-off by a change in the second control circuit and the input light recovery by a change in the first control circuit. Thus, it can be easily understood that the circuit in FIG. 10 performs the same operation as that in FIG. 9, without need to explain FIG. 10.

Figure 12:
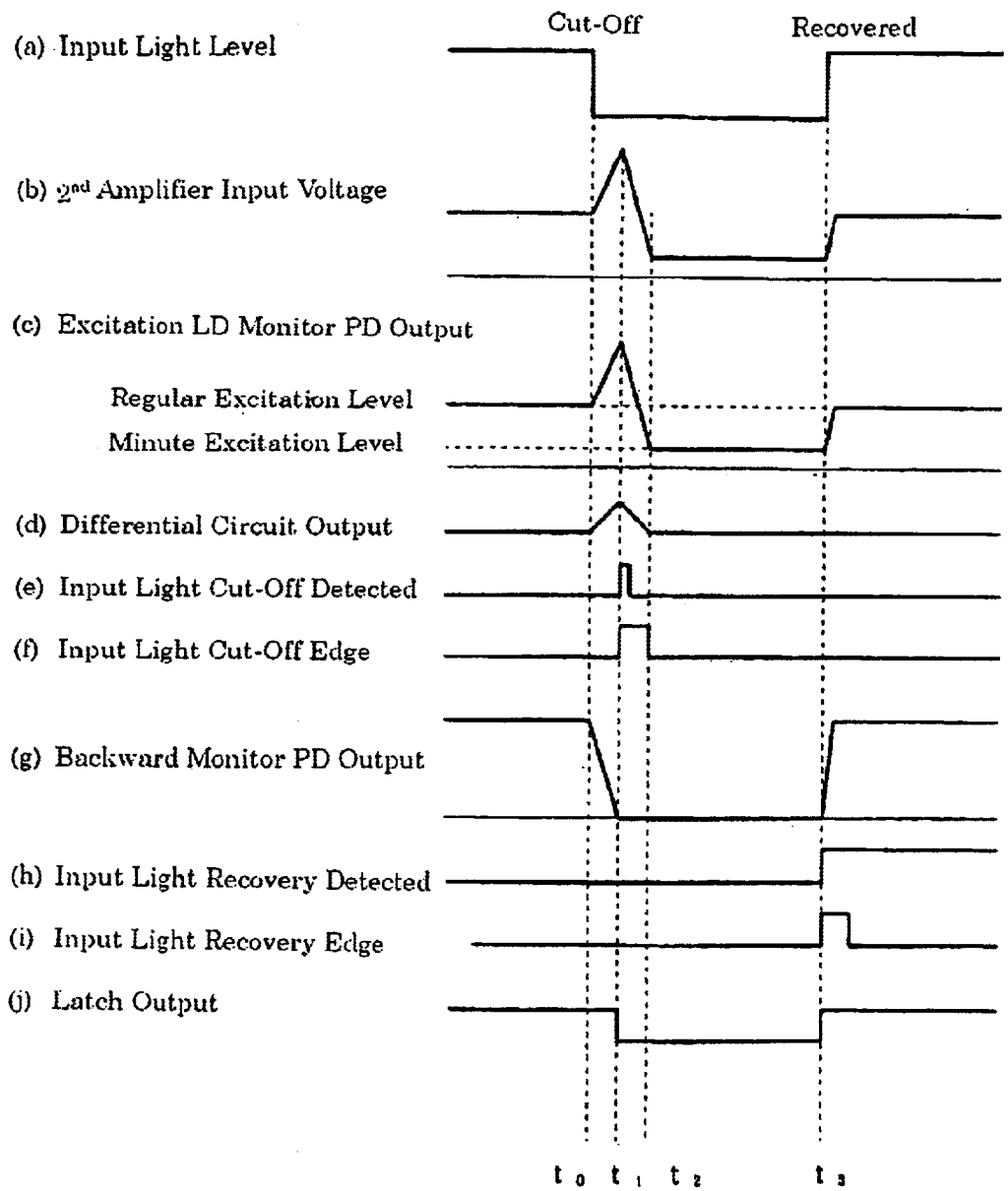
FIG. 12 is a timing chart illustrating the input light cut-off and recovery operations of the optical amplifier in FIG. 11.

FIG. 12 is a timing chart illustrating the input light cut-off and recovery operations of the optical amplifier in FIG. 11. FIG. 12 is the same as FIG. 9 without need to explain FIG. 12, except that the signal for detecting the input light cut-off is derived from the comparator 31-161 by the output of the differentiation circuit. Although an example is taken in FIG. 11, to differentiate the output of the photodiode 31-141, the same operation can be performed by differentiating the output of the analog switch 31-19 or the output of the differential amplifier 31-151. A circuit for differentiating the output of the photodiode 31-81 may be provided, although not shown in FIG. 11.

Although the circuit in FIG. 11 and the operations in FIG. 12 were almost omitted to explain, note that if the differential amplifier 31-101 is an inverting amplifier responsive to the output of the o/e converter 31-8, the differential amplifier 31-151 is a non-inverting amplifier responsive to the output of the analog switch 31-19. If the differential amplifier 31-101 is a non-inverting amplifier respective to the output of the o/e converter 31-8, the differential amplifier 31-151 is an inverting amplifier responsive to the output of the analog switch 31-19.

As is apparent from the above description, the present invention can keep the optical output level constant and when the input light is cut off, it can decrease the output of the excitation light source, only by detecting the optical signal level at a post-stage of the fiber, without need to detect the optical signal level at a pre-stage of the optical amplifier fiber and decrease the output of the excitation light source for exciting the energy level of the optical amplifier fiber.

That is, according to the first aspect of the present invention, when the input light is cut off, the optical amplifier detects a change in the output level via the first control circuit, supplies the second constant voltage to the second control circuit and supplies a constant driving current to the excitation light source. When the input light is normal, the optical amplifier detects a change in the output level via the first control circuit, supplies the output of the first control circuit to the second control circuit and supplies to the excitation light source a driving current required to keep the output light level of the optical amplifier constant. Therefore, the optical amplifier can suppress the output of the excitation light source at the input light cut-off time and also keep the output level of the excitation light source constant.

Also, according to the second aspect of the present invention, when the input light is cut off, the optical amplifier detects a change in the output level via the first control circuit, supplies the second constant voltage to the second control circuit and supplies a constant driving current to the excitation light source. Also, the optical amplifier detects that the input light is normal by a change in the output level via the first control circuit, supplies the output of the first control circuit to the second control circuit and supplies to the excitation light source a driving current required to keep the output light level of the optical amplifier constant. Therefore, the optical amplifier can suppress the output of the excitation light source at the input light cut-off time and also keep the output level of the excitation light source constant.

Further, according to the third aspect of the present invention, by supplying the second constant voltage to the second amplifier when the input light is cut off, the optical amplifier can prevent the optical amplifier fiber from generating a light surge when the input light recovers from the cut-off.

What is claimed is:

1. An optical amplifier for amplifying a light signal inputted to an optical amplifier medium and outputting an amplified light signal by exciting the optical amplifier medium with an excitation light, comprising:
   a first control circuit for amplifying the difference between a first predetermined voltage and a voltage indicative of the level of the amplified light to output a first amplified voltage;

a second control circuit for amplifying the difference between a voltage indicative of the level of the excitation light and a selected one of the first amplified voltage and a second predetermined voltage to output a second amplified voltage and controlling the excitation light based on the second amplified voltage; and a selector circuit for detecting a change in the first amplified voltage and depending on the change, selecting the first amplified voltage or a second predetermined voltage.

2. An optical amplifier for amplifying a light signal inputted to an optical amplifier medium and outputting an amplified light signal by exciting the optical amplifier medium with an excitation light, comprising:

a first control circuit for amplifying the difference between a first predetermined voltage and a voltage indicative of the level of the amplified light to output a first amplified voltage;

a second control circuit for amplifying the difference between a voltage indicative of the level of the excitation light and a selected one of the first amplified voltage and a second predetermined voltage to output a second amplified voltage and controlling the excitation light based on the second amplified voltage; and a selector circuit for detecting a change in the first and second amplified voltages and depending on the change, selecting the first amplified voltage or a second predetermined voltage.

3. The optical amplifier according to claim 1, the second predetermined voltage enables the excitation light strength to be reduced to a predetermined level.

4. A method for amplifying a light signal inputted to an optical amplifier medium and outputting an amplified light signal by exciting the optical amplifier medium with an excitation light, comprising the steps of:

(a) amplifying the difference between a first predetermined voltage and a voltage indicative of the amplified light to output a first amplified voltage;

(b) detecting a change in the first amplified voltage and depending on the change, selecting the first amplified voltage or a second predetermined voltage; and (c) amplifying the difference between the voltage selected in step (b) and a voltage indicative of the level of the excitation light to output a second amplified voltage and controlling the excitation light based on the second amplified voltage.

5. The method according to claim 4, wherein said detecting in step (b) further detects a change in the second amplified voltage.

6. A method for amplifying a light signal inputted to an optical amplifier medium and outputting an amplified light signal by exciting the optical amplifier medium with an excitation light, comprising the steps of:

(a) converting the amplified light into a voltage;

(b) amplifying the difference between a first predetermined voltage and the voltage converted in step (a) to output a first amplified voltage;

(c) detecting a change in the first amplified voltage and depending on the change, selecting the first amplified voltage or a second predetermined voltage;

(d) converting the excitation light to a voltage;

(e) amplifying the difference between the voltage selected in step (c) and the voltage converted in step (d) to output a second amplified voltage; and (f) controlling the excitation light based on the second amplified voltage.

7. The method according to claim 6, wherein said detecting in step (c) further detects a change in the second amplified voltage.

8. The optical amplifier according to claim 2, wherein the second predetermined voltage enables the excitation light strength to be reduced to a predetermined level.

* * * * *

UNITED STATES PATENT AND TRADEMARK OFFICE
CERTIFICATE OF CORRECTION

PATENT NO.    : 6,912,085 B2                                              Page 1 of 1
DATED         : June 28, 2005
INVENTOR(S)   : Katsuhiko Hakomori et al.

It is certified that error appears in the above-identified patent and that said Letters Patent is hereby corrected as shown below:

Column 19,
Line 30, after "claim 1," insert -- wherein --.

Signed and Sealed this

Twenty-first Day of March, 2006

JON W. DUDAS
*Director of the United States Patent and Trademark Office*